US012248705B2

(12) United States Patent
Cariello et al.

(10) Patent No.: US 12,248,705 B2
(45) Date of Patent: *Mar. 11, 2025

(54) DYNAMIC MEMORY ADDRESS WRITE POLICY TRANSLATION BASED ON PERFORMANCE NEEDS

(71) Applicant: Micron Technology, Inc., Boise, ID (US)

(72) Inventors: Giuseppe Cariello, Boise, ID (US); Jonathan Scott Parry, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 17/865,760

(22) Filed: Jul. 15, 2022

(65) Prior Publication Data

US 2022/0350539 A1 Nov. 3, 2022

Related U.S. Application Data

(63) Continuation of application No. 16/521,385, filed on Jul. 24, 2019, now Pat. No. 11,435,944.

(51) Int. Cl.
*G06F 3/06* (2006.01)
*G06F 12/06* (2006.01)

(52) U.S. Cl.
CPC .......... *G06F 3/0659* (2013.01); *G06F 3/0604* (2013.01); *G06F 3/0673* (2013.01); *G06F 12/0646* (2013.01); *G06F 2212/1016* (2013.01)

(58) Field of Classification Search
CPC .... G06F 3/0659; G06F 3/0604; G06F 3/0673; G06F 12/0646; G06F 2212/1016;
(Continued)

(56) References Cited

U.S. PATENT DOCUMENTS 9,785,572 B1 * 10/2017 Lercari ................ G06F 3/0688
11,435,944 B2    9/2022 Cariello et al.
(Continued)

FOREIGN PATENT DOCUMENTS

CN            102521160         6/2012

OTHER PUBLICATIONS

Qian, Zhao, et al., "Research and Implementation of Addressing Method Based on NAND Flash Multichannel Storage System." Microelectronics & Computer, Sep. 5, 2018.

*Primary Examiner* — Hosain T Alam
*Assistant Examiner* — Zubair Ahmed
(74) *Attorney, Agent, or Firm* — Greenberg Traurig

(57) ABSTRACT

Systems and methods of memory operation involving dynamic adjustment of write policy based on performance needs are disclosed. In one embodiment, an exemplary method may comprise monitoring memory performance parameters related to a programming operation being scheduled, selecting a write policy based on the memory performance parameters monitored, executing a memory control process that is configured to switch between the first addressing scheme and the second addressing scheme, and programming a first superpage of the programming operation using the first addressing scheme and programing a second superpage of the programming operation using the second addressing scheme.

16 Claims, 6 Drawing Sheets

(58) Field of Classification Search
CPC ...... G06F 3/061; G06F 3/0638; G06F 3/0679; G06F 12/0246; G06F 2212/7208; G06F 2212/7202; G11C 11/5628; G11C 16/349
USPC .................................................. 711/154, 100
See application file for complete search history.

(56) References Cited

U.S. PATENT DOCUMENTS

| | | | |
|---|---|---|---|
| 2006/0149974 A1* | 7/2006 | Rotem | G06F 11/3058 713/300 |
| 2007/0043854 A1* | 2/2007 | Shum | H04L 67/1097 709/224 |
| 2007/0067501 A1* | 3/2007 | Maharana | G06F 3/0613 710/14 |
| 2010/0322020 A1 | 12/2010 | Kim | |
| 2011/0040927 A1* | 2/2011 | Fuxa | G06F 11/1044 711/E12.008 |
| 2011/0153908 A1* | 6/2011 | Schaefer | G06F 12/0607 711/E12.078 |
| 2016/0148694 A1 | 5/2016 | Chang et al. | |
| 2017/0199703 A1* | 7/2017 | Ravimohan | G06F 12/1009 |
| 2018/0260135 A1 | 9/2018 | Hayashida et al. | |
| 2019/0303293 A1 | 10/2019 | Byun | |
| 2021/0026557 A1 | 1/2021 | Cariello et al. | |

* cited by examiner

DYNAMIC MEMORY ADDRESS WRITE POLICY TRANSLATION BASED ON PERFORMANCE NEEDS

RELATED APPLICATIONS

The present application is a continuation application of U.S. patent application Ser. No. 16/521,385 filed Jul. 24, 2019, the entire disclosures of which application are hereby incorporated herein by reference.

TECHNICAL FIELD

The present disclosure relates generally to semiconductor memory, and more particularly, to systems and methods for improving memory operation by dynamically adjusting write policy based on performance needs.

BACKGROUND

In modern Managed NAND systems or SSDs (solid-state drives), TLC (triplelevel cell) and QLC (quad-level cell) NAND pages cannot be written or programmed one by one (Lower/Upper/eXtra/Top pages). Accordingly FW can change data layout across different dice by providing all pages to one NAND before the others or change NAND before page (e.g. first lower pages on all die per channel followed by upper pages, then eXtra pages, then top pages). Certain advantages and disadvantages between these two programming styles relate to later read performance occurring after the write, the SRAM resources required to buffer the write data (as well as to buffer the read data), and the amount of padding needed if the system goes to sleep before a complete world line or programming pass is completed.

Further, there are correlations between system performance relating to large files that are being written and their subsequent read operations and requirements desired for such files. Here, for example, with regard to writing files either channel-fast or diefast, there are often differing advantages and disadvantages with respect to large versus small files, high versus low throughput, and/or high versus low queue depth.

The disclosed embodiments improve memory operation, such as by adjusting write policy dynamically (on the fly) during program operation based on performance needs, and/or otherwise remedy the above and other deficiencies of existing semiconductor memories.

BRIEF DESCRIPTION OF THE DRAWINGS

The foregoing and other objects, features, and advantages of the disclosure will be apparent from the following description of embodiments as illustrated in the accompanying drawings, in which reference characters refer to the same parts throughout the various views. The drawings are not necessarily to scale, emphasis instead being placed upon illustrating principles of the disclosure.

DETAILED DESCRIPTION

In semiconductor memory, such as managed multi-level NAND systems or SSDs, triple-level cell (TLC) and quad-level cell (QLC) pages can be written or programmed one-by-one, e.g., by each die per channel, or by each channel. As indicated above, there are advantages and disadvantages regarding both techniques. According to innovations herein, by detecting the host throughput and write performance needed, the data can be laid out into the pages/dies/channels using {\i both} approaches while switching between the two in a dynamic (on the fly) fashion. As explained further, below, aspects of the disclosed technology may take into account various memory performance parameters and/or correlation in system performance for large files written and later read. For example, for large files or high throughput or high queue depth, the data can be written channel-fast. For small files or low throughput or low queue depth, especially with a pattern of many sleep states, the pattern of programming may then be changed on the next superpage to be die-fast.

Figure 1A:
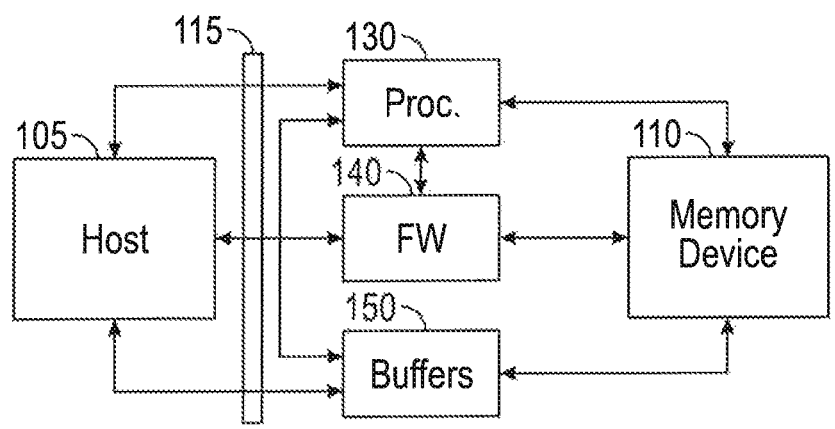
FIG. 1A is a simplified block diagram of a memory system, according to some embodiments of the disclosure.

FIG. 1A illustrates an example system 101 including a host 105 and a memory device 110. One or more processors 130, firmware 140, and buffers 150 are also included within the system 101, and these components may be discrete, located within or associated with the host 105, the memory device 110, and/or distributed among two or more of such locations. The host 105 can include a host processor, a central processing unit, or one or more other device, processor, or controller. The memory device 110 can include a universal flash storage (UFS) device, an embedded MMC (eMMC) device, or one or more other memory devices. The host 105 and the memory device 110 can communicate using a communication interface (I/F) 115 (e.g., a bidirectional parallel or serial communication interface, etc.).

In an example, the memory device 110 may include a UFS device, and the communication interface 115 can include a serial bidirectional interface, such as defined in one or more Joint Electron Device Engineering Council (JEDEC) standards (e.g., JEDEC standard D223D (JESD223D), commonly referred to as JEDEC UFS Host Controller Interface (UFSHCI) 3.0, etc.). In another example, the memory device 110 can include an eMMC device, and the communication interface 115 can include a number of parallel bidirectional data lines (e.g., DAT[7:0]) and one or more command lines, such as defined in one or more JEDEC standards (e.g., JEDEC standard D84-B51 (JESD84A51), commonly referred to as JEDEC eMMC standard 5.1, etc.). In other examples, the memory device 110 can include one or more other memory devices, or the communication interface 115 can include one or more other interfaces, depending on the host 105 and the memory device 110.

Each of the host 105 and the memory device 110 can include a number of receiver or driver circuits configured to send or receive signals over the communication interface 115, or interface circuits, such as data control units, sampling circuits, or other intermedia circuits configured to process data to be communicated over, or otherwise process data received from the communication interface 115 for use by the host 105, the memory device 110, or one or more other circuits or devices.

The memory device 110 can include a memory array (e.g., one or more arrays of memory cells, such as a NAND flash memory array, or one or more other memory arrays), a memory controller, and in certain embodiments, interface circuitry between the memory array and the memory controller, some examples of which are explained below in connection with FIG. 1B. In certain embodiments, the memory array can include a number of memory die, each having control logic separate from the memory controller. The memory controller can include an application specific integrated circuit (ASIC), a field programmable gate array (FPGA), or one or more other processing circuits arranged or programmed to manage data transfers or operations to, from, or within the memory array.

Figure 1B:
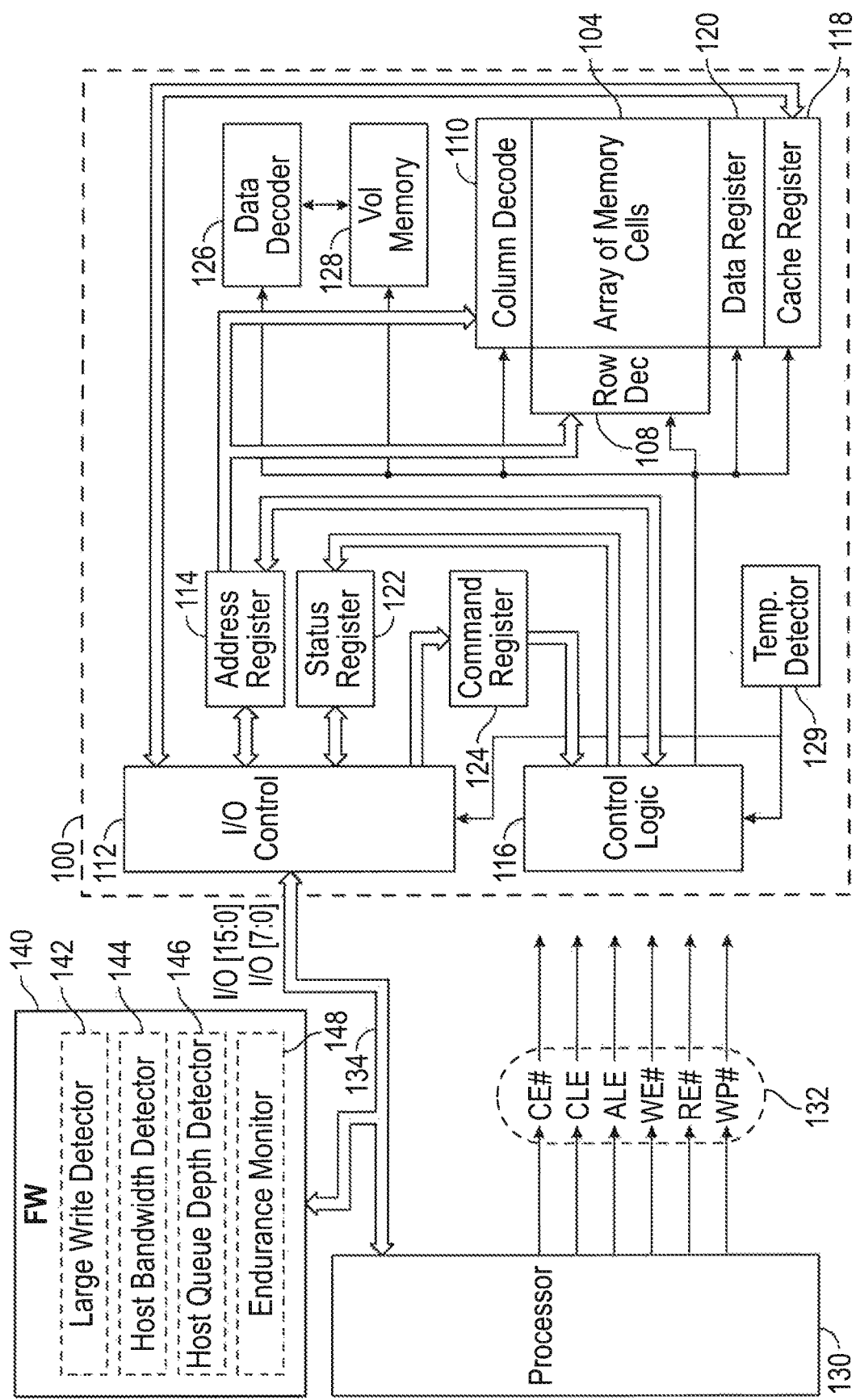
FIG. 1B is a simplified block diagram of a memory in communication with a processor and firmware, as part of a memory system, according to some embodiments of the disclosure.

FIG. 1B is a simplified block diagram of an exemplary memory circuitry or an electronic system, in the form of a memory (e.g., memory device 100), in communication with both a second apparatus, in the form of a processor 130, as well as a third apparatus, in the form of firmware, according to certain embodiments of the disclosure. Some examples of electronic systems include personal computers, personal digital assistants (PDAs), digital cameras, digital media players, digital recorders, games, appliances, vehicles, wireless devices, cellular telephones and the like. The processor 130, which in some embodiments can be, e.g., a controller external to the memory device 100, may be a memory controller or other external host device. Memory device 100 includes an array of memory cells 104 logically arranged in rows and columns. Memory cells of a logical row are typically connected to the same access line (commonly referred to as a word line) while memory cells of a logical column are typically selectively connected to the same data line (commonly referred to as a bit line). A single access line may be associated with more than one logical row of memory cells and a single data line may be associated with more than one logical column. Memory cells (not shown in FIG. 1B) of at least a portion of array of memory cells 104 are capable of being programmed to one of at least two data states.

A row decode circuitry 108 and a column decode circuitry 110 are provided to decode address signals. Address signals are received and decoded to access the array of memory cells 104. Memory device 100 also includes input/output (I/O) control circuitry 112 to manage input of commands, addresses and data to the memory device 100 as well as output of data and status information from the memory device 100. An address register 114 is in communication with I/O control circuitry 112 and row decode circuitry 108 and column decode circuitry 110 to latch the address signals prior to decoding. A command register 124 is in communication with I/O control circuitry 112 and control logic 116 to latch incoming commands.

A controller (e.g., the control logic 116 internal to the memory device 100) controls access to the array of memory cells 104 in response to the commands and generates status information for the processor 130, i.e., control logic 116 is configured to perform access operations (e.g., read operations, program operations and/or erase operations) in accordance with embodiments described herein. The control logic 116 is in communication with row decode circuitry 108 and column decode circuitry 110 to control the row decode circuitry 108 and column decode circuitry 110 in response to the addresses.

Control logic 116 is also in communication with a cache register 118. Cache register 118 latches data, either incoming or outgoing, as directed by control logic 116 to temporarily store data while the array of memory cells 104 is busy writing or reading, respectively, other data. During a program operation (e.g., write operation), data is passed from the cache register 118 to data register 120 for transfer to the array of memory cells 104; then new data is latched in the cache register 118 from the I/O control circuitry 112. During a read operation, data is passed from the cache register 118 to the I/O control circuitry 112 for output to the external processor 130; then new data is passed from the data register 120 to the cache register 118. A status register 122 is in communication with I/O control circuitry 112 and control logic 116 to latch the status information for output to the processor 130.

Data decoder circuitry 126 may decode raw data values read from the array of memory cells 104 prior to output of that data. For example, the data decoder circuitry 126 might decode raw data having a number of digits of data that is greater than a number of digits of user data. That is, the raw data may contain hard data, e.g., representative of user data, and soft data, e.g., representative of additional information regarding that memory cell. The output of the data decoder circuitry 126 for a given memory cell might have a number of digits of data corresponding to the number of digits of user data. Although depicted in FIG. 1B to be positioned in an exemplary relationship with the cache register 118 and the I/O control circuitry 112, the data decoder circuitry 126 could be configured and/or positioned differently, such as placed in other locations of the data path between the array of memory cells 104 and the I/O control circuitry 112. For example, the data decoder circuitry 126 might be part of the data register 120.

The data decoder 126 may be in communication with a volatile memory 128. Volatile memory 128 might include static random access memory (SRAM). The volatile memory 128 might contain information usable by the data decoder 126. The data decoder 126 and the volatile memory 128 may further be in communication with the control logic 116.

Memory device may also include a temperature detector 129, such as temperature detection circuitry, that is configured to provide feedback, e.g., via one or both of the control logic 116 and IO control circuitry 112, to the processor 130 and/or firmware 140 to potentially be factored-into the decision whether to switch to or from die-fast programming or channel-fast programming. This temperature detector 129 may communicate information such as increase or decrease in temperature, rate of temperature change, and/or whether certain temperatures or peaks, such as a high temperature peak, are approaching or are reached. Here, in one example, if the temperature of the memory is increasing, such temperature data may be utilized to switch the write policy to one that writes in fewer and fewer channels to reduce heat generation and peak power.

Memory device 100 receives control signals at control logic 116 from processor 130 over a control link 132. The control signals might include a chip enable CE #, a command latch enable CLE, an address latch enable ALE, a write enable WE #, a read enable RE #, and a write protect WP #. Additional or alternative control signals (not shown) may be further received over control link 132 depending upon the nature of the memory device 100. Memory device 100 receives command signals (which represent commands), address signals (which represent addresses), and data signals (which represent data) from processor 130 over a multiplexed input/output (I/O) bus 134 and outputs data to processor 130 over I/O bus 134.

For example, the commands are received over input/output (I/O) pins [7:0] of I/O bus 134 at I/O control circuitry 112 and are written into command register 124. The addresses are received over input/output (I/O) pins [7:0] of I/O bus 134 at I/O control circuitry 112 and are written into address register 114. The data are received over input/output (I/O) pins [7:0] for an 8-bit device or input/output (I/O) pins [15:0] for a 16 bit device at I/O control circuitry 112 and are written into cache register 118. The data are subsequently written into data register 120 for programming the array of memory cells 104. For another embodiment, cache register 118 may be omitted, and the data are written directly into data register 120. Data are also output over input/output (I/O) pins [7:0] for an 8-bit device or input/output (I/O) pins [15:0] for a 16-bit device.

In addition to providing other memory control functionality, firmware 140 may comprise a variety of optional subcomponents involved with monitoring the memory performance parameters. Here, for example, firmware 140 may comprise a write detector 142, a host bandwidth detector 144, a host queue depth detector 146, and an endurance monitor 148. A write detector subcomponent 142 may be configured to monitor for write data of interest or relevance to programming operations, such as large writes, small writes, writes conforming with known or learned patterns, as well as write data of other formats. The host bandwidth or throughput detector 144 may be configured to monitor host bandwidth conditions of interest or relevance to programming operations. Here, for example, the processor 130 may instruct the memory device to use a die-fast addressing technique when a host with high bandwidth or throughput is detected. The host queue depth detector 146 may be configured to monitor the depth or extent of the data to be written that is contained in the host's queue. Further, an endurance monitor 148 may also be included to monitor the quantity of program/erase cycles that the memory arrays have experienced. The firmware 140 may be coupled to at least one processor 130, e.g. via the I/O bus 134, to provide the monitored memory performance parameters to the processor 130.

Using the various information associated with a programming sequence to be scheduled, including the memory performance parameters being monitored, the processor 130 is configured to select a write policy, which may include a pattern of programming the memory. Here, write policy refers to the pattern and/or rules used to write data to the one or more memory arrays. In some embodiments, the write policy and/or such pattern of programming may be configured to instruct the memory device to write data using either a first addressing scheme (such as one configured for die-fast memory writes) or a second addressing scheme (such as one configured for channel-fast memory writes). While, in some embodiments, the processor may contain just two such addressing schemes, it may also contain many others, such as a variety of addressing schemes that provide instructions for memory operation in ways that are more optimal (e.g., efficient, etc.), based on the parameters monitored and/or any relevant rules related to the data to be written. In some embodiments, the processor 130 may provide instructions to the memory device to execute a memory control process that is configured to switch between two or more of schemes for a single programming sequence, such as between the first addressing scheme and the second addressing scheme. As such, the present implementations may include or involve a memory control process that assigns differing addressing scheme for successive superpages of a single programming sequence, rather than using only one type of addressing scheme (e.g., just die-fast, or just channel-fast, etc.) for each entire programming sequence. Accordingly, in some embodiments, the memory device may be configured to execute write policies and/or memory control processes that program a first superpage of the one or more memory arrays using die-fast writes via a first addressing scheme and program a second superpage using channel-fast writes via a second addressing scheme. As used herein, "superpage" refers to a memory page of larger size than a single page, and is typically comprised of a plurality of single pages, that can be programmed in a single parallel operation on one or more NAND dice.

It will be appreciated by those skilled in the art that additional circuitry and signals can be provided, and that the memory device 100 of FIG. 1B has been simplified. It should be recognized that the functionality of the various block components described with reference to FIG. 1B may not necessarily be segregated to distinct components or component portions of an integrated circuit device. For example, a single component or component portion of an integrated circuit device could be adapted to perform the functionality of more than one block component of FIG. 1B. Alternatively, one or more components or component portions of an integrated circuit device could be combined to perform the functionality of a single block component of FIG. 1B.

Additionally, while specific I/O pins are described in accordance with popular conventions for receipt and output of the various signals, it is noted that other combinations or numbers of I/O pins may be used in the various embodiments.

Figure 2:
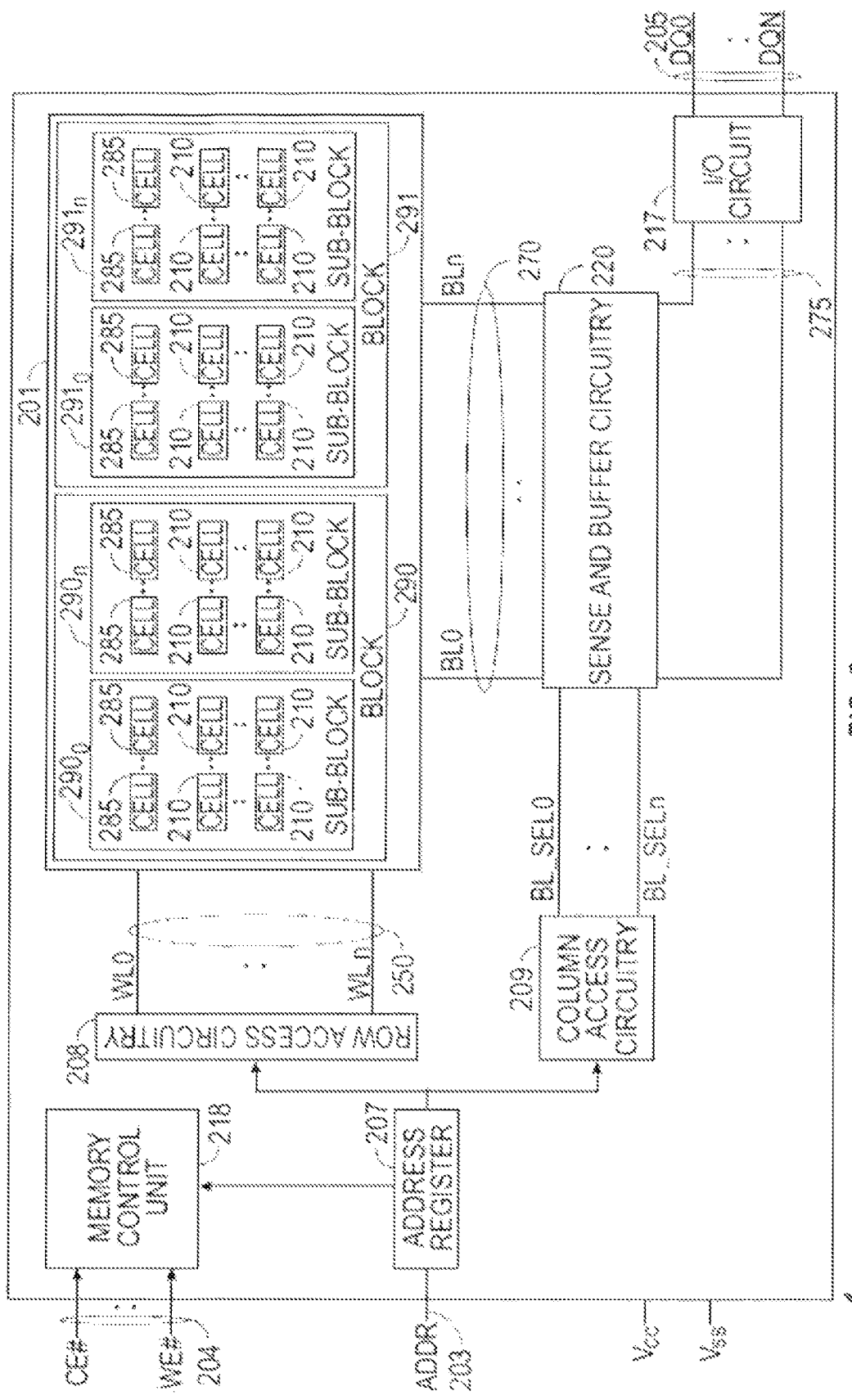
FIG. 2 is a simplified block diagram of an apparatus in the form of a memory device 200, according to some embodiments of the disclosure.

FIG. 2 shows a block diagram of an apparatus in the form of a memory device 200 including non-volatile memory cells. According to some embodiments described herein, such memory cells may have mixed memory cell types integrated in the same integrated circuit (IC) chip. Memory device 200 can include a memory array (or multiple memory arrays) 201 containing memory cells 210 and 285. In the physical structure of memory device 200, memory cells 210 and 285 can be arranged vertically (e.g., stacked over each other) over a substrate of memory device 200 (e.g., a semiconductor substrate of an IC chip that includes memory device 200). Memory cells 210 and 285 can include non-volatile cells. Memory cells 210 and 285 can have different nonvolatile memory cell types. For example, memory cells 210 can include floating gate memory cells, charge trap memory cells, or other types of non-volatile memory cells. Memory cells 285 can include ferroelectric memory cells, phase change memory cells, resistive memory cells, conduction bridge memory cells, and spin-transfer-torque magnetic random access memory (STT-MRAM) cells, or other types of non-volatile memory cells.

As shown in FIG. 2, memory cells 210 and 285 can be arranged in blocks (memory cell blocks), such as blocks 290 and 291. Each of blocks 290 and 291 can include sub-blocks. For example, block 290 can include sub-blocks $290_0$ and $290_n$, and block 291 can include subblocks $291_0$ and $291_n$. Each of sub-blocks $290_0$, $290_n$, $291_0$, and $291_n$ can include a combination of memory cells 210 and 285. FIG. 2 shows memory device 200 having two blocks 290 and 291 and two sub-blocks in each of the blocks as an example. Memory device 200 can have more than two blocks and more than two sub-blocks in each of the blocks.

As shown in FIG. 2, memory device 200 can include access lines (which can include word lines) 250 and data lines (which can include bit lines) 270. Access lines 250 can carry signals (e.g., word line signals) WL0 through WLm. Data lines 270 can carry signals (e.g., bit line signals) BL0 through BLn. Memory device 200 can use access lines 250 to selectively access sub-blocks $290_0$, $290_n$, $291_0$, and $291_n$ of blocks 290 and 291 and data lines 270 to selectively exchange information (e.g., data) with memory cells 210 of blocks 290 and 291.

Memory device 200 can include an address register 207 to receive address information (e.g., address signals) ADDR on lines (e.g., address lines) 203. Memory device 200 can include row access circuitry 208 and column access circuitry 209 that can decode address information from address register 207. Based on decoded address information, memory device 200 can determine which memory cells 210 of which subblocks of blocks 290 and 291 are to be accessed during a memory operation. Memory device 200 can perform a read operation to read (e.g., sense) information (e.g., previously stored information) in memory cells 210, or write (e.g., program) operation to store (e.g., program) information in memory cells 210. Memory device 200 can use data lines 270 associated with signals BL0 through BLn to provide information to be stored in memory cells 210 or obtain information read (e.g., sensed) from memory cells 210. Memory device 200 can also perform an erase operation to erase information from some or all of memory cells 210 of blocks 290 and 291.

Memory device 200 can include a memory control unit 218 (which can include components such as a state machine (e.g., finite state machine), register circuits, and other components) configured to control memory operations (e.g., read, write, and erase operations) of memory device 200 based on control signals on lines 204. Memory control unit 218 may also include one or more subcomponents and/or perform the functionality of other components, such as processor 130, firmware 140, and/or buffers 150, including any distributed components or subcomponents thereof. Examples of the control signals on lines 204 include one or more clock signals and other signals (e.g., a chip enable signal CE #, a write enable signal WE #) to indicate which operation (e.g., read, write, or erase operation) memory device 200 can perform.

Memory device 200 can include sense and buffer circuitry 220 that can include components such as sense amplifiers and page buffer circuits (e.g., data latches). Sense and buffer circuitry 220 can respond to signals BL_SEL0 through BL_SELn from column access circuitry 209. Sense and buffer circuitry 220 can be configured to determine (e.g., by sensing) the value of information read from memory cells 210 (e.g., during a read operation) of blocks 290 and 291 and provide the value of the information to lines (e.g., global data lines) 275. Sense and buffer circuitry 220 can also be configured to use signals on lines 275 to determine the value of information to be stored (e.g., programmed) in memory cells 210 of blocks 290 and 291 (e.g., during a write operation) based on the values (e.g., voltage values) of signals on lines 275 (e.g., during a write operation).

Memory device 200 can include input/output (I/O) circuitry 217 to exchange information between memory cells 210 of blocks 290 and 291 and lines (e.g., I/O lines) 205. Signals DQ0 through DQN on lines 205 can represent information read from or stored in memory cells 210 of blocks 290 and 291. Lines 205 can include nodes within memory device 200 or pins (or solder balls) on a package where memory device 200 can reside. Other devices external to memory device 200 (e.g., a memory controller or a processor) can communicate with memory device 200 through lines 203, 204, and 205.

Memory device 200 can receive a supply voltage, including supply voltages Vcc and Vss. Supply voltage Vss can operate at a ground potential (e.g., having a value of approximately zero volts). Supply voltage Vcc can include an external voltage supplied to memory device 200 from an external power source such as a battery or alternating current to direct current (AC-DC) converter circuitry.

Each of memory cells 210 can be programmed to store information representing a value of a fraction of a bit, a value of a single bit, or a value of multiple bits such as two, three, four, or another number of bits. For example, each of memory cells 210 can be programmed to store information representing a binary value "0" or "1" of a single bit. The single bit per cell is sometimes called a single-level cell. In another example, each of memory cells 210 can be programmed to store information representing a value for multiple bits, such as one of four possible values "00", "01", "10", and "11" of two bits, one of eight possible values "000", "001", "010", "011", "100", "101", "110", and "111" of three bits, or one of other values of another number of multiple bits. A cell that has the ability to store multiple bits is sometimes called a multi-level cell (or multi-state cell).

Memory device 200 can include a non-volatile memory device, such that memory cells 210 and 285 can retain information stored thereon when power (e.g., voltage Vcc, Vss, or both) is disconnected from memory device 200. For example, memory device 200 can be a flash memory device, such as a NAND flash (e.g., 3dimensional (3-D) NAND) or a NOR flash memory device, or another kind of memory device, such as a variable resistance memory device (e.g., a phase change memory device or a resistive RAM (Random Access Memory) device). One of ordinary skill in the art may recognize that memory device 200 may include other components not shown in FIG. 2 so as not to obscure the example embodiments described herein.

In memory device 200, memory cells 210 can be configured to store information (e.g., user data). In some embodiments, memory cells 285 may not be configured to permanently store information such as user information, but they may be used by memory device 200 as temporary storage cells during an operation (e.g., a write operation) of storing information (e.g., user data) in memory cells 210 in order to improve operations of memory device 200.

At least a portion of memory device 200 can include structures and perform operations similar to or identical to the structures and operations of any of the memory devices described elsewhere herein. Structuring and operating a memory device (e.g., memory device 200) as described herein allows the memory device to have improvements over some conventional memory devices.

Figure 3:
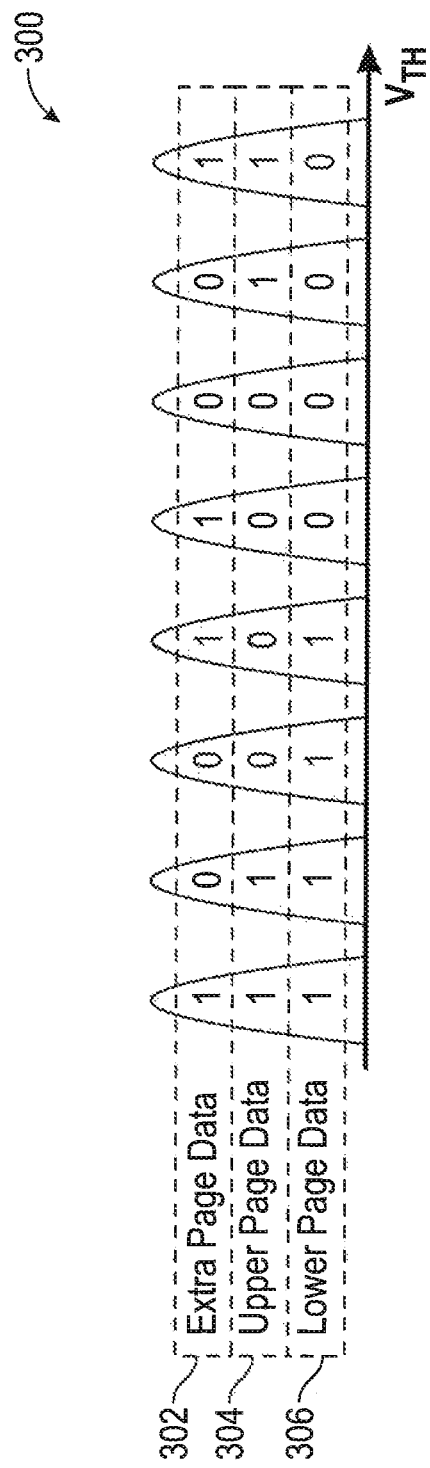
FIG. 3 is a diagram illustrating an exemplary triple-level memory cell consistent with some embodiments of the disclosure.

FIG. 3 is an illustration representing how data is stored in an exemplary triplelevel memory consistent with some embodiments of the disclosure. Referring to memory device 200 of FIG. 2, each of memory cells 210 and 285 may be configured to store more than one bit of information per cell. FIG. 3 illustrates how each cell may store 3 bits, e.g., one bit each by means of a lower page value 306, an upper page value 304 and an extra page value 302. Such memory cells may take on eight states or levels (e.g., level 0 (L0) through level 7 (L7)) corresponding to eight different combinations of three bits. Level L0 is often called an erase level (e.g., erase state), and such cells may have 7 program levels or states. Each of levels L0 through L7 has a threshold voltage value range for a large number of memory cells. Other numbers of bits and levels can be used in the programming (e.g., two bits for four levels, or four bits for sixteen levels).

Returning to in FIG. 2, the memory control unit 218 may load a page of data to be programmed in the sense and buffer circuitry 220. The programming algorithm performed by the memory control unit 218 may begin with programming the memory cells to be written to L0 in an erase cycle. Memory cells can be written one memory page at a time or multiple memory pages at a time. Successive programming passes can be used to program the memory cells with data. The first pass may program all the bits to be programmed to L1 (or $Vt_1$). The programming, or placing, of all the L1 bits can be verified before moving on to the L2 bits. For memory cells for which programming to $Vt_1$ could not be verified, the memory controller may try to place an increased $Vt_1$ in these memory cells. This change in $Vt_1$ plus the variation in the memory cells can produce the threshold voltage range of $Vt_1$ shown in FIG. 3A. Programming or placement of the threshold voltage in the cells then progresses through placing the L2 through L7 threshold levels to complete programming the memory cells.

Further, some managed memory systems suspend program and erase operations to service requested reads, e.g., to meet QoS requirements. However, due to limitations on page buffering, it is not possible to suspend a cache program operation after the next memory page is loaded in the buffer. To keep latency in read operations low, the memory control unit 218 delays the inputs of the next page as close as possible to the end of the programming of the current page. However, finding the optimal delay in loading data can be time consuming and costly. Additionally, a fixed delay may be impractical. Even after an optimal delay for a design is determined, the optimal delay for a particular implementation can vary with silicon, temperature, voltage, and can change with memory cell aging.

Figure 4:
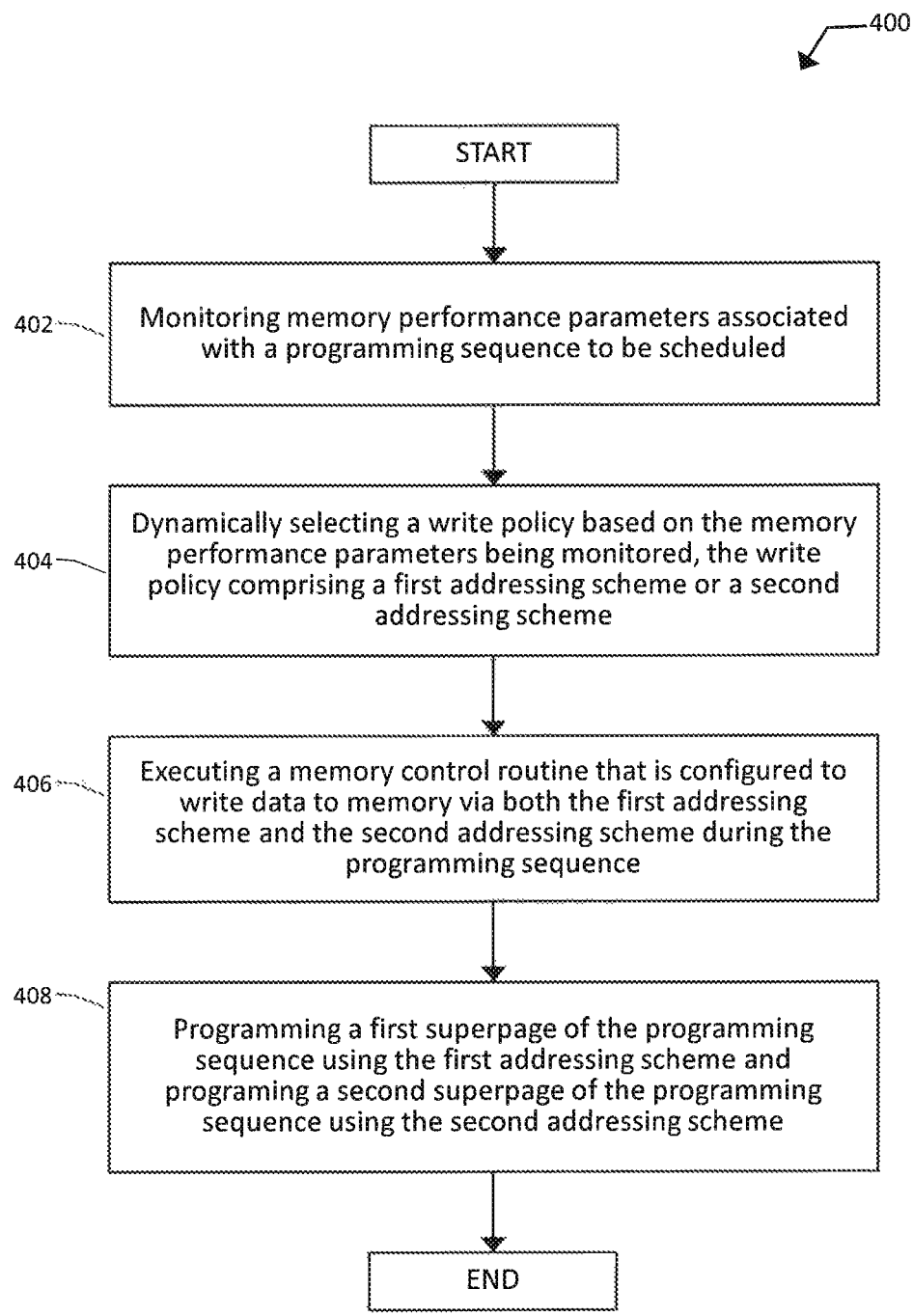
FIG. 4 is a flow chart illustrating an exemplary method of memory operation, according to some embodiments of the disclosure.

FIG. 4 is a flow chart illustrating an exemplary method of memory operation, according to some embodiments of the disclosure. Referring to FIG. 4, an exemplary method of memory operation consistent with embodiments herein may comprise monitoring memory performance parameters associated with a sequence of memory writes to be scheduled 402, dynamically selecting a write policy based on the memory performance parameters being monitored 404, executing a memory control process that is configured to write data to memory via both a first addressing scheme and a second addressing scheme during a single programming sequence 406, and programming a first superpage of the single programming sequence using the first addressing scheme and programing a second superpage of the single programming sequence using the second addressing scheme 408. Further, the memory control process may be configured to switch between addressing schemes for each superpage to be written.

According to embodiments herein, the first addressing scheme may comprise a die-fast write technique and the second addressing scheme may comprise a channel-fast write technique. In some implementations, the memory performance parameters that are monitored may include one or more of host throughput, host bandwidth, queue depth, quantity of data to write, write endurance level, speed that current data is being written, complexity of data to be written, idle time, probability of idle or sleep, pattern or trend detected in data currently being written, one or more patterns derived from previous writes (here, 'previous writes' spans from historical writes up through writes performed immediately prior to a switch between addressing schemes), and at least one rule specifying a write policy to use for data having a particular format.

In some embodiments, the memory control process may comprise reserving more or fewer memory buffers for write data when an addressing scheme that requires more or less padding is selected. Here, by way of one example, switching to a 'die-fast' addressing scheme may correlate to less padding being needed to complete a programming sequence, such as a single-pass program unit of a TLC (triple-level cell) lower/upper/eXtra page structure, hence the control routine may include instructions that free-up corresponding buffer space. By having the control routine trigger such instructions for on benchmark cases like large writes and storing the data as page-fast, memory such as SRAM can be dynamically configured on the fly to reserve more SRAM buffer for write data. When a benchmark case like reads are detected based on host throughput and activity, more SRAM data can be reserved for reads, thereby better servicing both the die-fast and channel-fast data layout.

Further, the memory control process may be configured to perform writes, for each next superpage of data to be written, by either the first addressing scheme or the second addressing scheme selected, such that programming of a memory may be achieved using two different addressing schemes during a single programming operation or sequence.

In some embodiments, the step of selecting a write policy based on the memory performance parameters monitored 404 may comprise assessing the memory performance parameters and/or the data to be written against one or more rules to determine the write policy to select. Such rules may be provided, programmed, based on pattern recognition, based on history of operation, and/or learned for a specific memory system or implementation. Here, for example, according to certain implementations, methods may further comprise analyzing historical information regarding the memory performance parameters previously monitored and the data previously written, as well as optionally the results of previous writes, to train the memory operation to recognize, or create rules regarding, information regarding successful programming behavior (where such rules creation, e.g., based on historically successful programming behavior, is also referred to herein as 'hysteresis'), and, in the selecting step 404, assessing the information regarding successful programming behavior to determine the write policy to select.

By means of embodiments herein, memory arrays may be programmed with the data of a single memory write operation in a channel-fast manner and then in a die-fast manner on adjacent superpages during a single memory write operation. In some implementations, based on the memory operation being configured for switching between the first addressing scheme and the second addressing scheme for successive superpages as well as power savings and/or improved use of the memory buffers associated with the switching, the memory operation has improved performance (such as greater efficiency) in response to different power levels dictated by a controller than memory operations configured to write only die-fast or only channel-fast for a single memory write operation.

Figure 5:
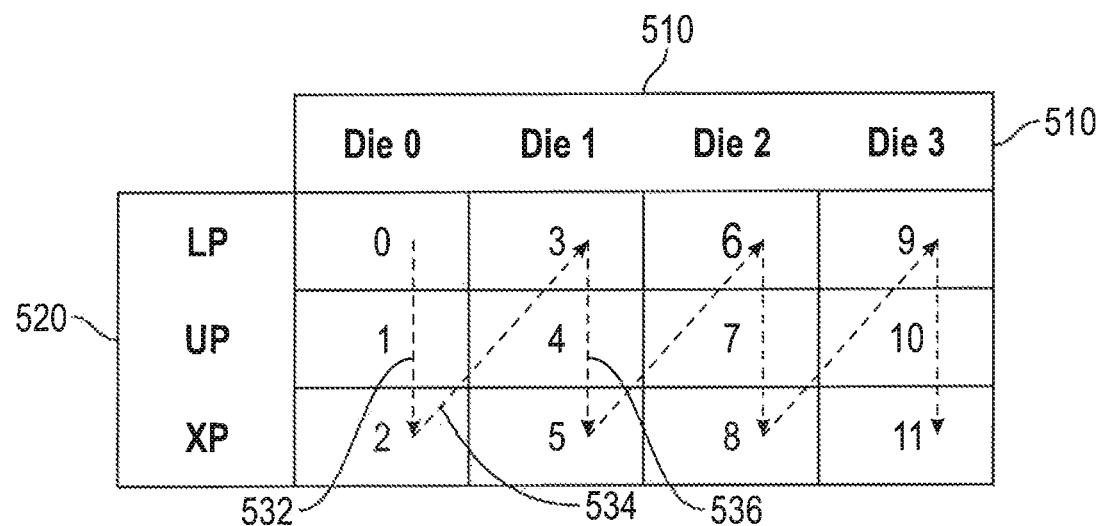
FIG. 5 is a diagram of an illustrative layout for write policy addressing showing an example of die-fast programing, according to some embodiments of the disclosure.
Figure 6:
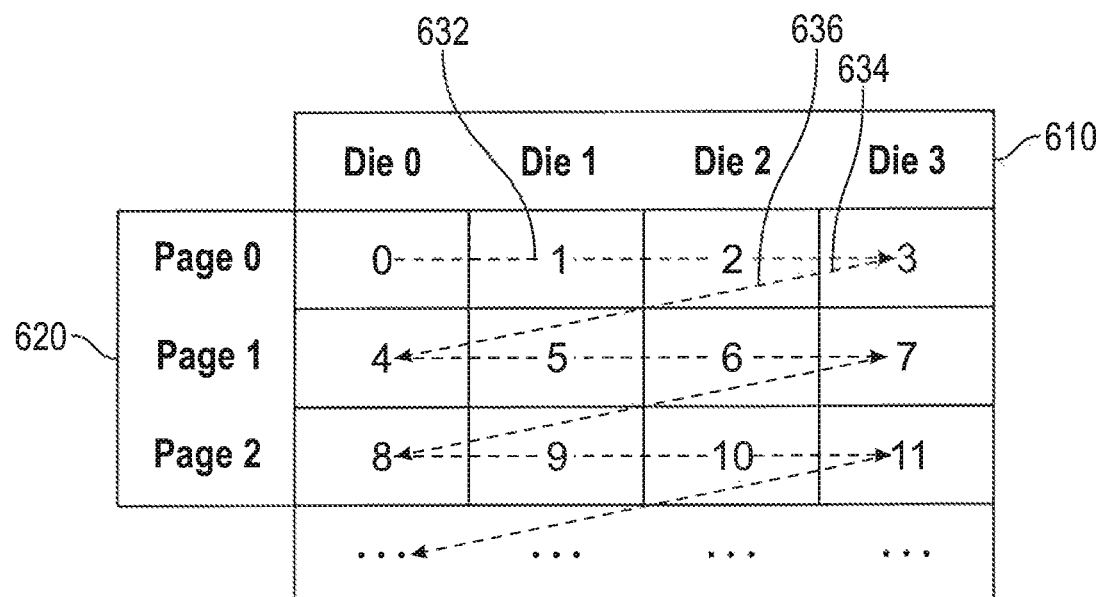
FIG. 6 is a diagram of an illustrative layout for write policy addressing showing an example of page-fast programing, according to some embodiments of the disclosure.

FIGS. 5-6 are diagrams illustrating exemplary layouts of the two write policy page/die/channel addressing approaches discussed herein, die-fast programming and page-fast programming. Similar, expanded versions of such diagram are applicable to 8- or 16-die memory structures. In general, with regard to managed NAND subsystems, the following example hierarchical ordering of physical memory organizational aspects involved in such subsystems and techniques may also be considered when determining suitable die-fast and page-fast approaches:
1. Channel
2. Rank (e.g., based on chip enable [CE #], etc.)
3. Die (e.g., selected die per CE # or chip, etc.)
4. Plane (e.g., bank in DRAM, etc.)
5. Page (e.g., row in DRAM, etc.)
6. Column (e.g., in NAND, most of the page is typically accessed, etc.)

Further, additional schemes in between these two approaches, such as 2 bonded channels or 2 bonded dies, may also be implemented. In addition to this, die fast scheme can be applied to die's planes and page sectors to further reduce granularity of program operations and reduce padding in particular circumstances.

FIG. 5 is a diagram of an illustrative layout for write policy addressing showing an example of die-fast programing, according to some embodiments of the disclosure. Such process of writing all of the pages, per die, before proceeding to write the next die, is referred to herein as illustrative die-fast programming. Referring to the above list of physical memory aspects, then, an exemplary hierarchical order of memory aspects utilized in die-fast approaches may be:
7. Die
8. Rank
9. Channel
10. Plane
11. Page
12. Column In the above, however, the lower tiers, e.g., tiers 4-6, may be in different order and still fall within the ambit of the die-fast programming approaches herein.

FIG. 5 illustrates exemplary die-fast programming of a 4-die, triple-level cell (TLC) memory structure, with the four die shown arranged horizontally at top 510, and the 3 page levels, lower page (LP), upper page (UP) and extra page (XP), arranged vertically at 520. Referring to FIG. 5, such die-fast programming may be configured to write the lower page of the first die (die 0), first, then proceed programming that die, at 532, by writing the upper page of die 0, next, and then writing the extra page of die 0, before transitioning to the second die (die 1), as shown via 534, to begin programming die 1. Such die-fast programming scheme may then proceed through programming the 3 page levels of die 1 (LP, UP, then XP), as shown via 536, before transitioning to, and programming die 2 and die 3 in like manner. With regard to illustrative buffer space needed and used to perform such die-fast programming, a representative write buffer needs 192 kB space, while the read buffer needs 768 kB and will have poor read performance unless reads are greater than 576 kB or QD>5 for 128 kB read. Accordingly, the dummy padding needed to complete a die for this example will be 128 kB of write data.

Other programming techniques for writing data may also be referred to as channel-fast programming. Referring to the above list of physical memory aspects, here, an exemplary hierarchical order of memory aspects utilized in channel-fast approaches may be:
13. Channel
14. Rank
15. Die
16. Plane
17. Page
18. Column FIG. 6 is a diagram of an illustrative layout for write policy addressing showing an example of page-fast programing, according to some embodiments of the. Such process of writing the data for each page to all of the dice, first, before proceeding to write the data for the next page, is referred to herein as illustrative of page-fast programming. Referring back to the above list of physical memory aspects, then, an exemplary hierarchical order of memory aspects utilized in page-fast approaches may be:
19. Page
20. Plane
21. Die
22. Channel
23. Rank
24. Column The above hierarchy of a page-fast approach might also be referred to as a page+planefast approach, if terminology of greatest technical accuracy is desired. Another pagefast approach may have the following hierarchy, with the following also being referred to as a plane+page-fast approach:
1. Plane
2. Page
3. Die
4. Rank
5. Channel
6. Column Further, in both of these page-fast approaches immediately above, the lower tiers, e.g., tiers 4-6, may be in different order and still fall within the ambit of the page-fast programming approaches herein.

FIG. 6 illustrates exemplary channel-fast programming of a 4-die, triple-level cell (TLC) memory structure, with the four dies shown arranged horizontally at top 610, and with various pages to be written, e.g. page 0, page 1, and page 2, arranged vertically at 620. Such channel-fast programming may be configured to write the buffered data into the memory one page at a time, i.e., transitioning through all of the dies for each page before writing the next page. Referring to the embodiment of FIG. 6, for example, the page 0 data is written first, to die 0, then die 1, then die 2, and then die 3 (for the 4-die memory herein), as shown via the arrow at 632. This channel-fast programming then returns to die 0, as shown via arrow 634, to begin writing the page 1 data. As with the page 0 data, the page 1 data is written to die 0, first, then to die 1, then die 2, and then die 3, as shown via the arrow at 636. With regard to representative memory resources needed for such channel-fast programming, as discussed above in FIG. 5, the write buffer may need, e.g., 768 kB, while the read buffer only needs 320 kB and will have good read performance for 256 kB reads or QD>1 for 128 kB reads. As such, the dummy padding utilized to complete a superpage for this example will be 768 kB of write data.

Accordingly, such configuration to switch between different write policies enables optimal use of buffer space and other memory allocation. As such, having such flexibility to program each superpage of data 'by die' (die-fast) or versus 'by channel' (channel-fast) allows the firmware to switch every 192 kB or versus 768 kB of write data, allowing optimal garbage collection, wear-leveling, and single-level cell (SLC) cache behavior.

Additionally, such as in situations where the NAND endurance is low, the firmware may be configured to permanently scale down from channel-fast or 'by channel' programming to die-fast or 'by die' programming.

With regard to power savings, addressing schemes consistent with the disclosed technology may be utilized to perform fewer parallel writes if there is a scenario such as thermal throttling needed or the host needs NAND bandwidth for mixed-use cases and wants to give priority over reads.

The following examples help illustrate how the innovations herein may be utilized in memories with multiple dies per channel. Furthermore, since caching accesses more pages per die, the following examples also help illustrate how the present innovations may be used in caching. In these examples, the number/index (starting from 0, then 1, 2, 3, 4, 5, etc.) represents the order in which data is stored in memory, such as managed NAND, from 0 to 'N'.

To begin, a basic die-fast approach may be:

|    | Channel 0 Die 0 | Channel 0 Die 1 | Channel 0 Die 2 | Channel 0 Die 3 |
|----|-----|-----|-----|-----|
| LP | 0 | 3 | 6 | 9 |
| UP | 1 | 4 | 7 | 10 |
| XP | 2 | 5 | 8 | 11 |

An approach for die-fast, then channels may be:

|    | Channel 0 Die 0 | Channel 1 Die 1 | Channel 2 Die 2 | Channel 3 Die 3 |
|----|-----|-----|-----|-----|
| LP | 0 | 3 | 6 | 9 |
| UP | 1 | 4 | 7 | 10 |
| XP | 2 | 5 | 8 | 11 |

An approach for die-fast, then channel-fast may be:

|    | Channel 0 Die 0 | Channel 0 Die 1 | Channel 1 Die 2 | Channel 1 Die 3 | Channel 2 Die 4 | Channel 2 Die 5 | Channel 3 Die 6 | Channel 3 Die 7 |
|----|---|---|---|----|----|----|----|----|
| LP | 0 | 3 | 6 | 9  | 12 | 15 | 18 | 21 |
| UP | 1 | 4 | 7 | 10 | 13 | 16 | 19 | 22 |
| XP | 2 | 5 | 8 | 11 | 14 | 17 | 20 | 23 |

Turning to cache programming, an approach for cache-fast, then die-fast, then channel-fast may be:

|        | Channel 0 Die 0 | Channel 0 Die 1 | Channel 1 Die 2 | Channel 1 Die 3 | Channel 2 Die 4 | Channel 2 Die 5 | Channel 3 Die 6 | Channel 3 Die 7 |
|--------|---|----|----|----|----|----|----|----|
| LP     | 0 | 6  | 12 | 18 | 24 | 30 | 36 | 42 |
| UP     | 1 | 7  | 13 | 19 | 25 | 31 | 37 | 43 |
| XP     | 2 | 8  | 14 | 20 | 26 | 32 | 38 | 44 |
| LP + 1 | 3 | 9  | 15 | 21 | 27 | 33 | 39 | 45 |
| UP + 1 | 4 | 10 | 16 | 22 | 28 | 34 | 40 | 46 |
| XP + 1 | 5 | 11 | 17 | 23 | 29 | 35 | 41 | 47 |

Compare, also, the above to page-fast or channel-fast first. Page-fast:

|    | Channel 0 Die 0 | Channel 0 Die 1 | Channel 0 Die 2 | Channel 0 Die 3 |
|----|-----|-----|-----|-----|
| LP | 0 | 3 | 6 | 9 |
| UP | 1 | 4 | 7 | 10 |
| XP | 2 | 5 | 8 | 11 |

Page-fast (also channel-fast):

|     | Channel 0 Die 0 | Channel 1 Die 1 | Channel 2 Die 2 | Channel 3 Die 3 |
| --- | --- | --- | --- | --- |
| LP  | 0 | 3 | 6 | 9 |
| UP  | 1 | 4 | 7 | 10 |
| XP  | 2 | 5 | 8 | 11 |

Page-fast, then channel-fast:

|     | Channel 0 Die 0 | Channel 1 Die 1 | Channel 2 Die 2 | Channel 3 Die 3 | Channel 0 Die 4 | Channel 1 Die 5 | Channel 2 Die 6 | Channel 3 Die 7 |
| --- | --- | --- | --- | --- | --- | --- | --- | --- |
| LP  | 0 | 1 | 2 | 3 | 12 | 13 | 14 | 15 |
| UP  | 4 | 5 | 6 | 7 | 16 | 17 | 18 | 19 |
| XP  | 8 | 9 | 10 | 11 | 20 | 21 | 22 | 23 |

Channel-fast, then page-fast:

|     | Channel 0 Die 0 | Channel 1 Die 1 | Channel 2 Die 2 | Channel 3 Die 3 | Channel 0 Die 4 | Channel 1 Die 5 | Channel 2 Die 6 | Channel 3 Die 7 |
| --- | --- | --- | --- | --- | --- | --- | --- | --- |
| LP  | 0 | 1 | 2 | 3 | 4 | 5 | 6 | 7 |
| UP  | 8 | 9 | 10 | 11 | 12 | 13 | 14 | 15 |
| XP  | 16 | 17 | 18 | 19 | 20 | 21 | 22 | 23 |

Another embodiment of cache programming may comprise programing that is cache-fast, then page-fast, then channel-fast:

|     | Channel 0 Die 0 | Channel 1 Die 1 | Channel 2 Die 2 | Channel 3 Die 3 | Channel 0 Die 4 | Channel 1 Die 5 | Channel 2 Die 6 | Channel 3 Die 7 |
| --- | --- | --- | --- | --- | --- | --- | --- | --- |
| LP  | 0 | 1 | 2 | 4 | 24 | 25 | 26 | 28 |
| UP  | 4 | 5 | 6 | 7 | 28 | 29 | 30 | 31 |
| XP  | 8 | 9 | 10 | 11 | 32 | 33 | 34 | 35 |
| LP + 1 | 12 | 13 | 14 | 16 | 36 | 37 | 38 | 40 |
| UP + 1 | 16 | 17 | 18 | 19 | 40 | 41 | 42 | 43 |
| XP + 1 | 20 | 21 | 22 | 23 | 44 | 45 | 46 | 47 |

Furthermore, the subject matter disclosed above may be embodied in a variety of different forms and, therefore, covered or claimed subject matter is intended to be construed as not being limited to any example embodiments set forth herein; example embodiments are provided merely to be illustrative. Likewise, a reasonably broad scope for claimed or covered subject matter is intended. Among other things, for example, subject matter may be embodied as methods, devices, components, or systems. Accordingly, embodiments may, for example, take the form of hardware, software, firmware or any combination thereof (other than software per se). The following detailed description is, therefore, not intended to be taken in a limiting sense.

Throughout the specification and claims, terms may have nuanced meanings suggested or implied in context beyond an explicitly stated meaning. Likewise, the phrase "in one embodiment" as used herein does not necessarily refer to the same embodiment and the phrase "in another embodiment" as used herein does not necessarily refer to a different embodiment. It is intended, for example, that claimed subject matter include combinations of example embodiments in whole or in part.

In general, terminology may be understood at least in part from usage in context. For example, terms, such as "and", "or", or "and/or," as used herein may include a variety of meanings that may depend at least in part upon the context in which such terms are used. Typically, "or" if used to associate a list, such as A, B or C, is intended to mean A, B, and C, here used in the inclusive sense, as well as A, B or C, here used in the exclusive sense. In addition, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

Those skilled in the art will recognize that the methods and devices of the present disclosure may be implemented in many manners and as such are not to be limited by the foregoing exemplary embodiments and examples. In other words, aspects/elements can be performed by single or multiple components, in various combinations and/or subcombinations, and individual aspects, may be distributed among components and/or subcomponents. In this regard, any number of the features of the different embodiments described herein may be combined into single or multiple embodiments, and alternate embodiments having fewer than, or more than, all the features described herein are possible.

While various embodiments have been described for purposes of this disclosure, such embodiments should not be deemed to limit the teaching of this disclosure to those embodiments. Various changes and modifications may be made to the elements and features described above to obtain a result that remains within the scope of the systems and processes described in this disclosure.

The invention claimed is:

1. A device comprising:
at least one memory array configured on a plurality of dies; and
at least one processor configured to:
select a write policy of programming a plurality of pages of data to the at least one memory array, wherein the write policy is selected from a plurality of schemes including:
a first addressing scheme in which the plurality of pages are programmed on one of the plurality of dies sequentially one page after another; and
a second addressing scheme in which the plurality of pages are distributed to the plurality of dies for programming in parallel for the plurality of pages;
reserve a memory buffer according to the write policy selected to program the data into the memory array, wherein the memory buffer is of a first size for programming the data according to the first addressing scheme and of a second size different from the first size for programming the data according to the second addressing scheme; and
program the data, received from a host using the memory buffer, according to the write policy.

2. The device of claim 1, wherein the processor is further configured to:
monitor memory performance parameters;
wherein the policy is selected based on monitoring of the memory performance parameters.

3. The device of claim 1, wherein the processor is further configured to detect a host throughput, and select the policy based on the host throughput.

4. The device of claim 1, further comprising temperature detection circuitry, wherein the processor is further configured to select the policy based on an input from the temperature detection circuitry.

5. The device of claim 1, wherein the processor is further configured to monitor a depth of a host queue for the data to be written, wherein the policy is selected based on the depth of the host queue.

6. A system comprising:
a memory device comprising at least one memory array configured on a plurality of dies;
input/output control circuitry; and
at least one processor configured to:
select a write policy of programming a plurality of pages of data to the at least one memory array, wherein the write policy is selected from a plurality of schemes including:
a first addressing scheme in which the plurality of pages are programmed on one of the plurality of dies sequentially one page after another; and
a second addressing scheme in which the plurality of pages are distributed to the plurality of dies for programming;
reserve a memory buffer according to the write policy selected to program the data into the memory array, wherein the memory buffer is of a first size for programming the data according to the first addressing scheme and of a second size different from the first size for programming the data according to the second addressing scheme; and
program the data, received from a host using the memory buffer, according to the write policy.

7. A method, comprising:
selecting, by a memory device having memory cells on a plurality of dies, a write policy of programming a plurality of pages of data, wherein the write policy is selected from a plurality of schemes including:
a first addressing scheme in which the plurality of pages are programmed on one of the plurality of dies sequentially one page after another; and
a second addressing scheme in which the plurality of pages are distributed to the plurality of dies for programming in parallel for the plurality of pages;
reserving a memory buffer according to the write policy selected to program the data, wherein the memory buffer is of a first size for programming the data according to the first addressing scheme and of a second size different from the first size for programming the data according to the second addressing scheme; and
programming the data, received from a host using the memory buffer, according to the write policy.

8. The method of claim 7, further comprising:
monitoring a memory performance parameter, wherein the policy is selected based on the monitoring of the memory performance parameter.

9. The method of claim 8, wherein the memory performance parameter is host throughput.

10. The method of claim 8, wherein the memory performance parameter is temperature.

11. The method of claim 8, wherein the memory performance parameter is depth of host queue.

12. The method of claim 8, wherein the memory performance parameter is write endurance level.

13. The method of claim 8, wherein the memory performance parameter is idle time.

14. The method of claim 8, wherein the plurality of pages of data are programmed into memory cells each configured to store a plurality of bits, including upper page data, lower page data, and extra page data.

15. The method of claim 14, wherein the plurality of pages of data are programmed into a plurality of pages of memory cells on the plurality of dies respectively when the programming of the data is according to the second addressing scheme.

16. The method of claim 14, wherein the same page of memory cells are programmed to store a plurality of bits per memory cell; and each of the plurality of pages corresponds to one of the plurality of bits.

* * * * *